United States Patent
Aoki

(10) Patent No.: US 9,232,684 B2
(45) Date of Patent: Jan. 5, 2016

(54) POWER CONVERTER

(75) Inventor: Takashi Aoki, Fukuoka (JP)

(73) Assignee: KABUSHIKI KAISHA YASKAWA DENKI, Kitakyushu-Shi (JP)

(*) Notice: Subject to any disclaimer, the term of this patent is extended or adjusted under 35 U.S.C. 154(b) by 906 days.

(21) Appl. No.: 13/398,716

(22) Filed: Feb. 16, 2012

(65) Prior Publication Data

US 2012/0261100 A1 Oct. 18, 2012

(30) Foreign Application Priority Data

Apr. 13, 2011 (JP) ................. 2011-088832

(51) Int. Cl.
   F28D 15/00    (2006.01)
   H05K 7/20    (2006.01)
   H02M 7/00    (2006.01)

(52) U.S. Cl.
   CPC .......... *H05K 7/20918* (2013.01); *H02M 7/003* (2013.01)

(58) Field of Classification Search
   None
   See application file for complete search history.

(56) References Cited

U.S. PATENT DOCUMENTS

| | | | | |
|---|---|---|---|---|
| 7,474,528 B1* | 1/2009 | Olesiewicz et al. | ............ | 361/695 |
| 7,542,289 B2* | 6/2009 | Tsai et al. | ...................... | 361/695 |
| 7,589,978 B1* | 9/2009 | Holdredge | ......... | H05K 7/20145 361/800 |
| 7,674,165 B2* | 3/2010 | Lu et al. | ........................ | 454/184 |
| 2007/0053771 A1* | 3/2007 | Wu et al. | ....................... | 415/119 |
| 2009/0168346 A1* | 7/2009 | Miyoshi | ........................ | 361/695 |
| 2012/0227930 A1* | 9/2012 | Rowe | ................. | H05K 7/20145 165/11.1 |
| 2013/0100610 A1* | 4/2013 | Schneider | .......... | H05K 7/20572 361/690 |

FOREIGN PATENT DOCUMENTS

| | | |
|---|---|---|
| JP | 03-155696 | 7/1991 |
| JP | 09-213532 | 8/1997 |
| JP | 2002-280779 | 9/2002 |
| JP | 2010-129629 | 6/2010 |

OTHER PUBLICATIONS

"Capacitor Characteristics" Basic Electronics Tutorials Site by Wayne Storr, copyright @ 1999-2014, http://www.electronics-tutorials.ws/capacitor/cap_3.html.*
Japanese Office Action for corresponding JP Application No. 2011-088832, May 2, 2013.
Chinese Office Action for corresponding CN Application No. 201210059513.0, Aug. 5, 2014.

* cited by examiner

*Primary Examiner* — Gregory Huson
*Assistant Examiner* — Martha Becton
(74) *Attorney, Agent, or Firm* — Mori & Ward, LLP

(57) ABSTRACT

A power converter includes: a plurality of heat generators, at least some of which are arranged within a wind tunnel portion; and a housing for enclosing the wind tunnel portion through which a cooling air flows. The wind tunnel portion includes a first and second duct each having a cooling air inlet and outlet port, a cooling air flow path, and a blower fan. Further, the cooling air flow paths overlap with each other in a parallel arrangement relationship; the cooling air inlet ports of the first duct and the second duct, and the cooling air outlet ports of the first duct and the second duct are arranged adjacent to each other; and the heat generators divisionally arranged within the first duct and the second duct.

4 Claims, 6 Drawing Sheets

POWER CONVERTER

CROSS-REFERENCE TO RELATED APPLICATIONS

The present application claims priority under 35 U.S.C. §119 to Japanese Patent Application No. 2011-088832 filed Apr. 13, 2011. The contents of this application are incorporated herein by reference in their entirety.

BACKGROUND OF THE INVENTION

1. Field of the Invention

The present invention relates to a power converter including a plurality of heat generators arranged within a housing.

2. Description of the Related Art

In general, a power converter for converting a direct-current power to an alternating-current power, or vice versa, includes a housing and a plurality of heat generators arranged within the housing, such as a semiconductor device for performing a switching operation and a heat sink (which is not a heat generator in a strict meaning but may be regarded as a heat generator in a broad meaning because it receives heat from the semiconductor device and grows hot). With a view to cool the heat generators, there is proposed a technology in which heat generators are cooled by allowing a cooling air to flow through a wind tunnel portion having heat sink arranged therein (see, e.g., Japanese Patent Application Publication 2002-280779).

SUMMARY OF THE INVENTION

In accordance with an aspect of the present invention, there is provided a power converter including: a plurality of heat generators, at least some of which are arranged within a wind tunnel portion; and a housing for enclosing the wind tunnel portion through which a cooling air flows. The wind tunnel portion includes: a first duct having a cooling air inlet port, a cooling air outlet port, a cooling air flow path extending between the cooling air inlet port and the cooling air outlet port and a first blower fan provided in the cooling air inlet port; and a second duct having a cooling air inlet port, a cooling air outlet port, a cooling air flow path extending between the cooling air inlet port and the cooling air outlet port and a second blower fan provided in the cooling air outlet port, the cooling air flow paths of the first duct and the second duct overlap with each other in a parallel arrangement relationship, the cooling air inlet ports of the first duct and the second duct being arranged adjacent to each other, the cooling air outlet ports of the first duct and the second duct being arranged adjacent to each other, the heat generators being divisionally arranged within the first duct and the second duct.

BRIEF DESCRIPTION OF THE DRAWINGS

The objects and features of the present invention will become apparent from the following description of preferred embodiments given in conjunction with the accompanying drawings.

DESCRIPTION OF THE EMBODIMENTS

An embodiment of the present invention will now be described with reference to the accompanying drawings. If an annotation reading "front", "rear", "left", "right", and "down" exists in the respective drawings, the front, rear, left, right, upper and lower directions in the detailed description of the subject specification will refer to the directions designated by the annotation. While an inverter will be described herein below as an example of a power converter, the present invention is not limited thereto. The present invention may be applied to any devices including a plurality of heat generators and a wind tunnel portion.

Figure 1A:
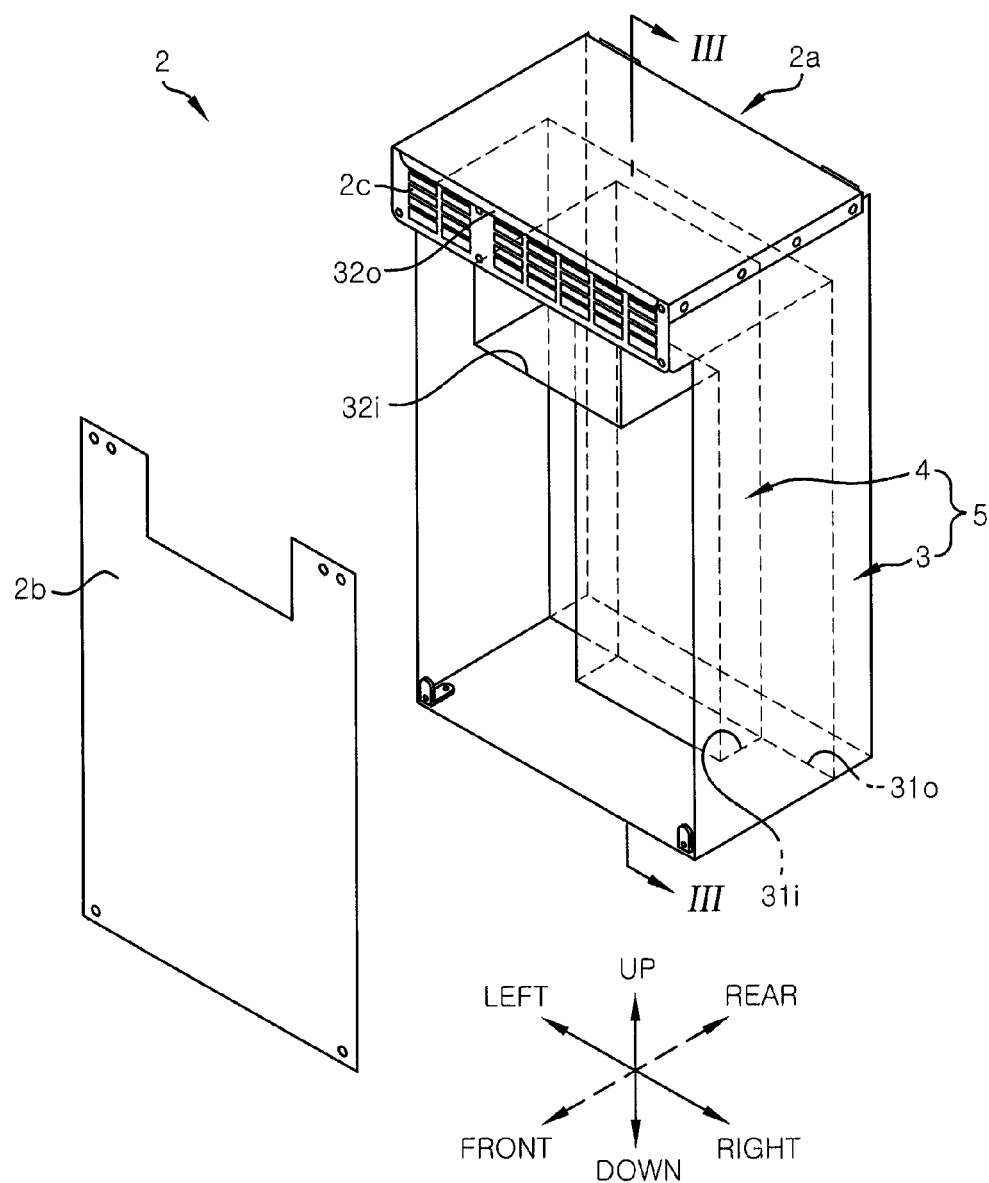
FIGS. 1A and 1B are partially-transparent perspective and exploded perspective views showing the overall configuration of a housing of an inverter according to one embodiment of the present invention.
Figure 1B:
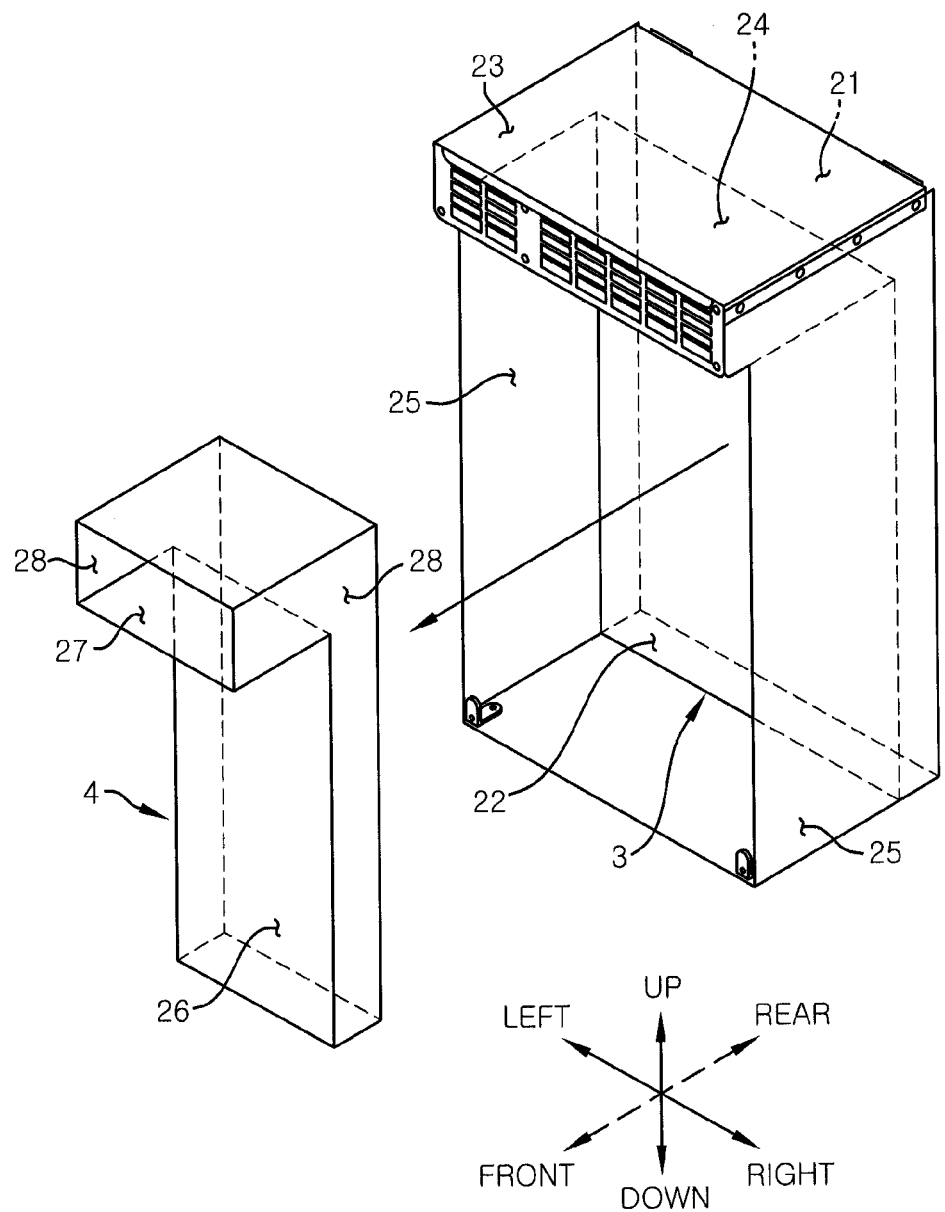
Figure 2:
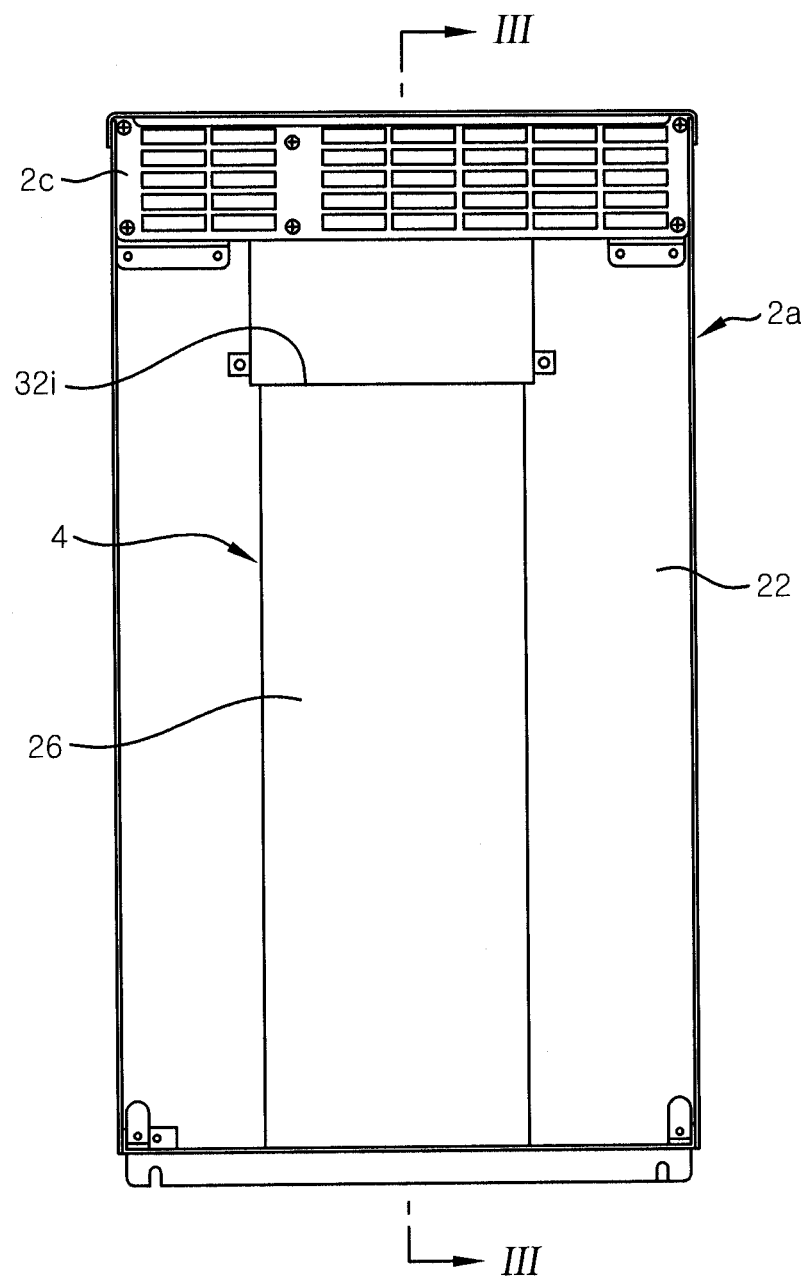
FIG. 2 is a front view of the housing of the inverter shown in FIG. 1.
Figure 3:
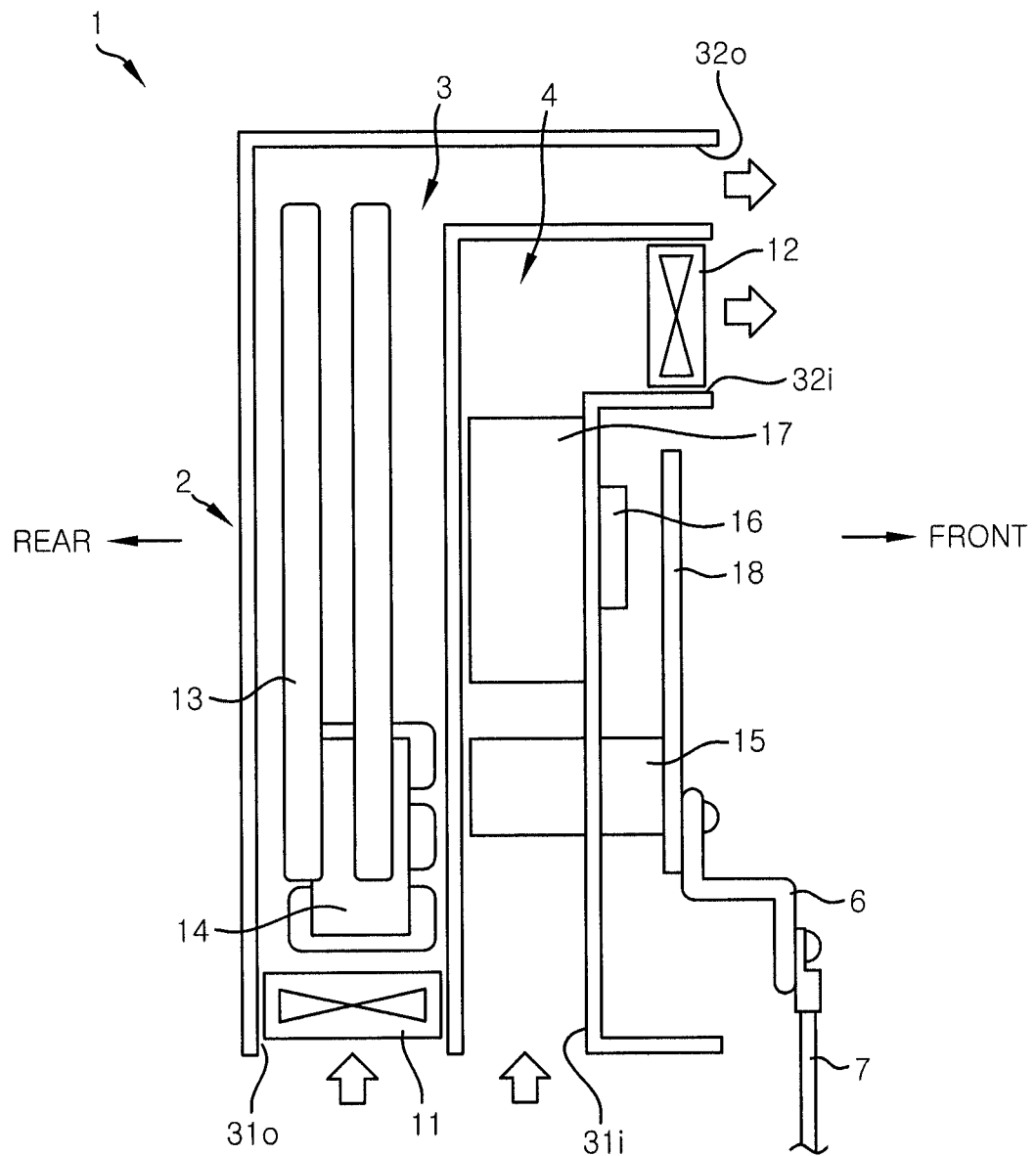
FIG. 3 is a side section view taken along line III-III in FIGS. 1A and 2.

Referring to FIGS. 1, 2 and 3, the inverter 1 (the power converter) of the present embodiment is a device for controlling the operation of a motor not shown in the drawings. The inverter includes a housing 2 having a substantially rectangular parallelepiped shape, a lower blower fan 11, an upper blower fan 12, a resistor 13, a reactor 14, a capacitor 15, a semiconductor device 16, a heat sink 17 and a circuit board 18.

Referring first to FIGS. 1 and 2, the housing 2 is formed into a substantially rectangular parallelepiped shape by joining metal plates as outer wall portions together. In the illustrated example, the housing 2 is installed in such a posture that the longitudinal direction thereof extends in the up-down direction. The housing 2 includes a housing body 2a and a housing cover 2b. The housing body 2a has an opening formed on the surface thereof facing forward in the installed state. The housing cover 2b is detachably attached to the opening of the housing body 2a and is arranged to cover the opening.

When the housing cover 2b is attached to the housing body 2a, the inside of the housing 2 as a whole becomes a hollow structure in which different components can be stored. In the present embodiment, a wind tunnel portion 5 through which a cooling air flows is provided within the housing body 2a. The wind tunnel portion 5 includes two ducts, i.e., an outer duct 3 and an inner duct 4, which are provided independently of each other so as not to communicate with each other.

In the following description, the side at which an opening exists when the housing 2 is installed in place will be defined as a front direction. The direction opposite to the front direction will be defined as a rear direction. The direction horizontally intersecting the front-rear direction will be defined as a left-right direction. The direction vertically intersecting the front-rear direction will be defined as an up-down direction. The definitions of the up-down, front-rear and left-right directions are equally applied to the outer duct 3 and the inner duct 4 provided within the housing 2.

The outer duct 3 includes a hollow space having a substantially L-like shape (a vertically-inverted substantially L-like shape, in the drawings). The outer duct 3 is surrounded by an outer rear wall portion 21 of the housing body 2a, an inner rear wall portion 22 arranged frontward of the outer rear wall portion 21 in a parallel opposing relationship therewith, an outer top wall portion of the housing body 2a, an inner top wall portion 24 arranged below the outer top wall portion 23 in a parallel opposing relationship therewith, and left and right outer side wall portions 25 of the housing body 2a.

The inner duct 4 includes a hollow space having a substantially L-like shape. The inner duct 4 is surrounded by the inner rear wall portion 22, an inner front wall portion 26 arranged frontward of the inner rear wall portion 22 in a parallel opposing relationship therewith, the inner top wall portion 24, an inner lower wall portion 27 arranged below the inner top wall portion 24 in a parallel opposing relationship therewith, and inner side wall portions 28 arranged inward of the outer side wall portions 25 in a parallel opposing relationship therewith.

The outer duct 3 and the inner duct 4 are opened at the lower ends and the upper front ends thereof to communicate with the ambient air. In the illustrated example, ventilation cover portions 2c capable of providing sufficient ventilation are arranged in an upper front opening of the outer duct 3 and in a lower opening of the inner duct 4 (the ventilation cover portion for the lower opening of the inner duct 4 is not shown in the drawings). The ambient air is introduced into the outer duct 3 and the inner duct 4 from the lower openings as cooling air inlet ports 31o and 31i. The air thus introduced flows through outer duct 3 and the inner duct 4 as a cooling air. The cooling air is discharged from the upper front openings as cooling air outlet ports 32o and 32i.

In other words, the outer duct 3 and the inner duct 4 serve as cooling air flow paths. In the illustrated example, the cooling air outlet ports 32o and 32i slightly protrude forward beyond the installation position of the housing cover 2b. The cooling air flow paths of the outer duct 3 and the inner duct 4 overlap with each other in a substantially parallel relationship. The cooling air inlet ports 31o and 31i are arranged adjacent to each other. Likewise, the cooling air outlet ports 32o and 32i are arranged adjacent to each other.

The outer duct 3, the inner duct 4 and the housing body 2a are formed into one piece by sharing the adjacent wall portions as set forth above. Alternatively, the outer duct 3, the inner duct 4 and the housing body 2a may be independently formed by their own wall portions. The dimensions of the respective portions of the outer duct 3 and the inner duct 4 are appropriately set in conformity with the sizes of the below-mentioned heat generators and the blowing areas of the below-mentioned blower fans.

Referring next to FIG. 3, the lower blower fan 11 of the present embodiment is formed of an axial flow fan and is arranged in the cooling air inlet port 31o of the lower end portion of the outer duct 3. While not specifically shown in the drawings, it is preferred that a plurality of lower blower fans 11 be arranged in the cooling air inlet port 31o over the entire opening of the latter. It is also preferred that the opening area of the cooling air inlet port 31o be set substantially equal to the total blowing area of the lower blower fans 11.

In the present embodiment, the upper blower fan 12 is also formed of an axial flow fan and is arranged in the cooling air outlet port 32i of the upper front end portion of the inner duct 4. While not specifically shown in the drawings, it is preferred that, just like the lower blower fan 11, a plurality of upper blower fans 12 be arranged in the cooling air outlet port 32i over the entire opening of the latter. It is also preferred that the opening area of the cooling air outlet port 32i be set substantially equal to the total blowing area of the upper blower fans 12.

The resistor 13 consumes regenerative energy when a so-called dynamic brake is applied to a motor (not shown) whose operation is controlled by the inverter 1. For that reason, the resistor 13 generates heat of relative high temperature while the dynamic brake is operating.

The reactor 14 is a coil through which an alternating current flows to improve the power factor of the electric power converted to the alternating current. For that reason, the reactor 14 generates heat when a high-frequency alternating current flows therethrough.

The capacitor 15 is used in smoothening a source power. The capacitor 15 receives a large alternating current and stores an increased amount of electric charges. For that reason, the capacitor 15 generates heat at all times.

The semiconductor device 16 is formed of, e.g., an IGBT (Insulated Gate Bipolar Transistor) device. The semiconductor device 16 performs a switching operation for converting a direct-current power to an alternating-current power. For that reason, the semiconductor device 16 generates heat of relatively high temperature during the switching operation. The semiconductor device 16 is closely attached to the heat sink 17.

The heat sink 17 is formed of a metal transferring heat with ease, e.g., aluminum or copper. The heat sink 17 is formed into a rectangular parallelepiped shape by, e.g., arranging a plurality of identically-shaped thin plates side by side. If the semiconductor device 16 generates heat, the heat is transferred to the heat sink 17 and diffused in the heat sink 17. Thus, the heat sink 17 grows hot.

An electronic circuit involving the operation of the inverter 1 is provided in the circuit board 18. The circuit board 18 is fixed to the housing 2 and is connected to a plurality of wiring lines 7 through connectors 6. While not specifically shown in the drawings, the wiring lines 7 are drawn downward through a bottom portion at the front side of the housing 2.

In the illustrated example, the components other than the circuit board 18, namely the resistor 13, the reactor 14, the capacitor 15, the semiconductor device 16 and the heat sink 17, become heat generators. Among the heat generators, the resistor 13, the reactor 14, the capacitor 15 and the heat sink 17 are arranged within the wind tunnel portion 5. The capacitor 15 extends through the inner front wall portion 26 so that the end portion thereof as a major heat generating portion can be positioned within the inner duct 4. The heat generation amount of the four heat generators grows larger in the order of the resistor 13, the heat sink 17, the capacitor 15 and the reactor 14.

In this regard, the heat generation amount refers to an amount of heat generation per unit hour. In the present embodiment, the resistor 13 having a largest heat generation amount and the reactor 14 having a smallest heat generation amount are arranged within the outer duct 3. The heat sink 17 having a second largest heat generation amount and the capacitor 15 having a third largest heat generation amount are arranged within the inner duct 4. However, the arrangement of the heat generators is not limited thereto and may be reversed.

With the arrangement and configuration described above, if the lower blower fan 11 and the upper blower fan 12 are operated, the ambient air is introduced into the outer duct and the inner duct 4 from the lower cooling air inlet ports 31o and 31i. The ambient air thus introduced flows upward as a cooling air. The cooling air flowing upward cools the respective heat generators. The flowing direction of the cooling air used in cooling the respective heat generators is changed by the outer top wall portion 23 and the inner top wall portion 24 so that the cooling air can flow forward. Then, the cooling air is discharged from the upper front cooling air outlet ports 32o and 32i of the respective ducts 3 and 4.

In the inverter 1 of the present embodiment described above, a plurality of heat generators which needs to be subjected to forced air cooling is divisionally stored within two ducts 3 and 4 and is air-cooled by the cooling air flowing through the respective ducts 3 and 4.

In the present embodiment, the wind tunnel portion 5 is formed of two ducts 3 and 4 and the cooling air is allowed to flow through the respective ducts 3 and 4. This makes it possible to prevent an increase in the flow resistance and to intensively and forcedly air-cool only the heat generators that need to be air-cooled.

The lower blower fan 11 is arranged in the cooling air inlet port 31o of the outer duct 3. The upper blower fan 12 is arranged in the cooling air outlet port 32i of the inner duct 4. If the blower fans 11 and 12 are installed in such a staggering arrangement, as compared with a case where the blower fans 11 and 12 are arranged side by side in the cooling air inlet ports 31o and 31i or in the cooling air outlet ports 32o and 32i, it is possible to appropriately adjust the diameter of the portion of each of the ducts 4 and 3 adjoining to each of the blower fans 11 and 12 (namely, the diameter of the cooling air inlet port 31i and the cooling air outlet port 32o). This makes it possible to reduce the overall size of the inverter.

Since the cooling air flow paths of the outer duct 3 and the inner duct 4 overlap with each other and extend in a parallel arrangement relationship with each other, it is possible to reduce the total volume of the outer duct 3 and the inner duct 4.

The outer duct 3 and the inner duct 4 are arranged so that the cooling air inlet ports 31o and 31i thereof can adjoin to each other and that the cooling air outlet ports 32o and 32i can adjoin to each other. In the outer duct 3, the lower blower fan 11 is provided only in the cooling air inlet port 31o. In the inner duct 4, the upper blower fan 12 is provided only in the cooling air outlet port 32i. In this case, the lower blower fan 11 in the outer duct 3 serves to introduce a cooling air into the cooling air inlet port 31o of the outer duct 3 and assists in introducing a cooling air into the cooling air inlet port 31i of the inner duct 4 adjoining to the cooling air inlet port 31o.

Likewise, the upper blower fan 12 in the inner duct 4 serves to discharge the cooling air from the cooling air outlet ports 32i of the inner duct 4 and assists in discharging the cooling air from the cooling air outlet port 32o of the outer duct 3 adjoining to the cooling air outlet ports 32i. Since the respective blower fans 11 and 12 assist each other in circulating the cooling air through the ducts 3 and 4, it is possible to efficiently circulate the cooling air and cool the heat generators with a simple blowing mechanism.

In case where the inverter 1 is fixed within a static space, a smooth circulating stream of air can be formed in the ambient space of the housing 2 by arranging the cooling air inlet ports 31o and 31i of the ducts 3 and 4 adjacent to each other and arranging the cooling air outlet ports 32o and 32i of the ducts 3 and 4 adjacent to each other. This makes it possible to efficiently introduce and discharge the cooling air.

With the present embodiment, it is therefore possible to enhance the cooling efficiency and to reduce the overall size of the inverter.

The blower fans 11 and 12 are components replaced with a relatively high frequency. In the present embodiment, the lower blower fan 11 of the outer duct 3 is arranged at the lower side of the housing 2. The upper blower fan 12 of the inner duct 4 is arranged at the upper front side of the housing 2. Accordingly, at least the upper blower fan 12 can be readily replaced without being affected by the wiring lines 7 extending toward the front lower side of the housing 2.

Therefore, as compared with a case where all the blower fans 11 and 12 are arranged in the lower portion of the housing 2, it is possible to enhance the ease of fan replacement works.

In addition, the double duct structure formed of two ducts 3 and 4 provides an advantage of improving the overall strength of the housing 2.

In the present embodiment, the resistor 13 having a largest heat generation amount and the heat sink 17 having a second largest heat generation amount among the heat generators are divisionally arranged within the outer duct 3 and the inner duct 4. This makes it possible to prevent concentrated heat generation in one of the ducts 3 and 4 and to perform the cooling in an efficient manner.

In addition, the resistor 13 a largest heat generation amount and the reactor 14 having a smallest heat generation amount are combined and arranged within the outer duct 3. The heat sink 17 having a second largest heat generation amount and the capacitor 15 having a third largest heat generation amount are combined and arranged within the inner duct 4. This helps substantially equalize the total sums of heat generation amount in the respective ducts 3 and 4, which makes it possible to perform the cooling in an efficient manner.

In the present embodiment, as shown in FIG. 1, all the ducts 3 and 3 are curved in the midway positions thereof to have a substantially L-like shape. This provides an advantage of enhancing the strength of the housing 2 as a whole.

In the present embodiment, the blowing area of each of the upper blower fan 12 and the lower blower fan 11 is substantially equal to the opening area of each of the cooling air inlet port 31o and the cooling air outlet port 32i in which the blower fans 11 and 12 are installed. Accordingly, the cooling air can flow at a flow rate suitable for the efficient cooling in any position without increasing the flow resistance within the respective ducts 3 and 4. This makes it possible to forcedly cooling the respective heat generators.

Alternatively, the upper blower fan 12 may be installed in the cooling air outlet port 32o formed at the upper front end of the outer duct 3. The lower blower fan 11 may be installed in the cooling air inlet port 31i formed at the lower end of the inner duct 4. In this case, it is possible to obtain the same effects as stated above.

The present invention is not limited to the embodiment described above but may be modified in many different forms without departing from the scope and spirit of the invention. Modified examples will now be described one after another.

(1) A Modified Example where the Blower Fan has an Increased Diameter

In case of the foregoing embodiment, as shown in the section view of FIG. 3, the thickness of the cooling air inlet ports 31o and 31i and the cooling air outlet ports 32o and 32i is set equal to the flow path thickness of the end portions of the respective ducts 3 and 4. The blower fans 11 and 12 installed in the corresponding positions have a diameter equivalent to the thickness of the cooling air inlet port 31o and the cooling air outlet port 32i. However, the present invention is not limited thereto.

Figure 4:
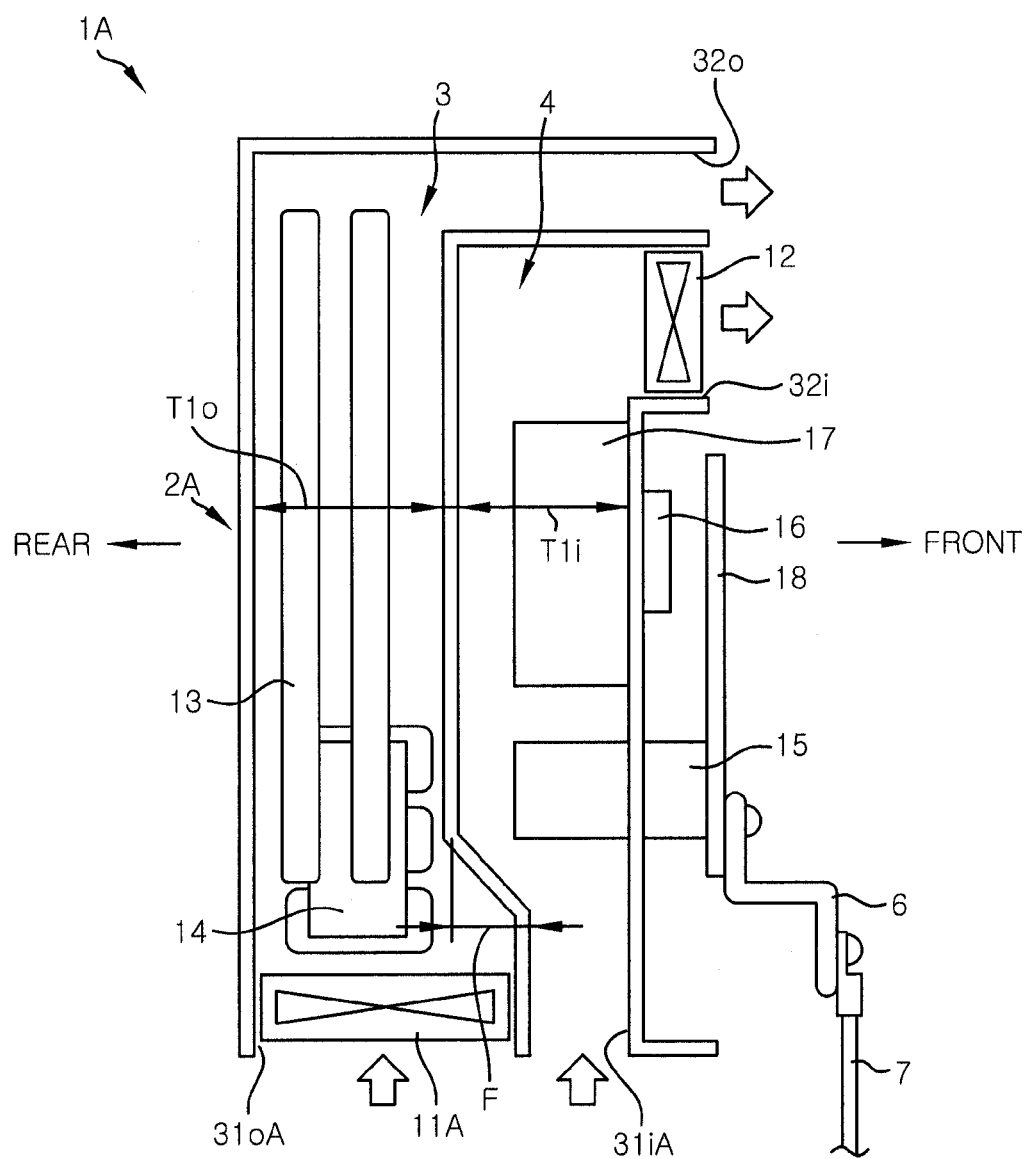
FIG. 4 is a side section view showing a modified example in which one of the blower fans has an increased diameter.

For example, as shown in FIG. 4, the thickness of the cooling air inlet port 31oA may be set greater than the flow path thickness of the end portion of the outer duct 3A near the cooling air inlet port 31oA. A blower fan 11A having an increased diameter may be installed in the cooling air inlet port 31oA. The term "flow path thickness" used herein refers to the flow path dimension in the direction perpendicular to the left-right direction of the housing 2 on the cross section perpendicular to the stream of the cooling air.

In other words, if the flow paths of the cooling air are curved as in the outer duct 3 and the inner duct 4 shown in FIGS. 3 and 4, the flow path thickness denotes the dimension in the front-rear direction of the up-down flow path portion or the dimension in the up-down direction of the front-rear flow path portion.

FIG. 4 is a side section view similar to FIG. 3, showing a modified example in which a cooling air inlet port 31oA of an outer duct 3A has an increased diameter and a blower fan 11A having an increased diameter is installed in the cooling air inlet port 31oA. Referring to FIG. 4, Tlo is a reference thickness which means the thickness of the up-down extension portion of the outer duct 3A above the cooling air inlet port 31oA measured in the overlapping direction of the longer sides of the outer duct 3A and the inner duct 4A, i.e., in the front-rear direction of the housing 2 in the illustrated example. Tli is a reference thickness which means the thickness of the up-down extension portion of the inner duct 4A above the cooling air inlet port 31iA.

The thickness of the cooling air inlet port 31oA of the lower end portion of the outer duct 3A is set greater than the reference thickness Tlo by a specified deviation value F. The lower blower fan 11A having an increased diameter equivalent to the thickness of the cooling air inlet port 31oA is installed in the cooling air inlet port 31oA. The thickness of the cooling air inlet port 31oA gets continuously reduced along the flow direction of the cooling air and becomes equal to the reference thickness Tlo after all.

On the other hand, the thickness of the cooling air inlet port 31iA of the lower end portion of the inner duct 4A is set smaller than the reference thickness Tli by the specified deviation value F. The thickness of the cooling air inlet port 31iA gets continuously increased along the flow direction of the cooling air and becomes equal to the reference thickness Tli after all. Accordingly, the changes in the thickness of the outer duct 3A and the inner duct 4A overlapping with each other are offset. The total thickness of the outer duct 3A and the inner duct 4A remains unchanged.

In the inverter 1A of the present modified example described above, a large quantity of cooling air drawn by the lower blower fan 11A having an increased blowing area flows into the flow path having a small reference thickness Tlo. Thus, the flow velocity of the cooling air is increased in the outer duct 3A, which makes it possible to enhance the cooling function. In the inner duct 4A, the cooling air inlet port 31iA having a small opening area serves to constrict the flow path of the cooling air. Thus, the flow velocity of the cooling air is increased in the flow path near the cooling air inlet port 31iA, which makes it possible to enhance the cooling performance (particularly, with respect to the capacitor 15 arranged near the cooling air inlet port 31iA).

With the present modified example, it is possible to enhance the cooling performance within the outer duct 3A and the inner duct 4A while reducing the overall size of the respective ducts 3A and 4A overlapping with each other.

While the blower fan having an increased diameter is provided at the side of the cooling air inlet ports 31oA and 31iA in the present modified example, the present invention is not limited thereto. Alternatively, the blower fan having an increased diameter may be provided at the side of the cooling air outlet ports 32o and 32i or at the side of both the cooling air inlet ports 31oA and 31iA and the cooling air outlet ports 32o and 32i. In either case, it is possible to obtain the same effects as stated above.

(2) A Modified Example where the Ducts are Formed into a Rectilinear Shape

Figure 5:
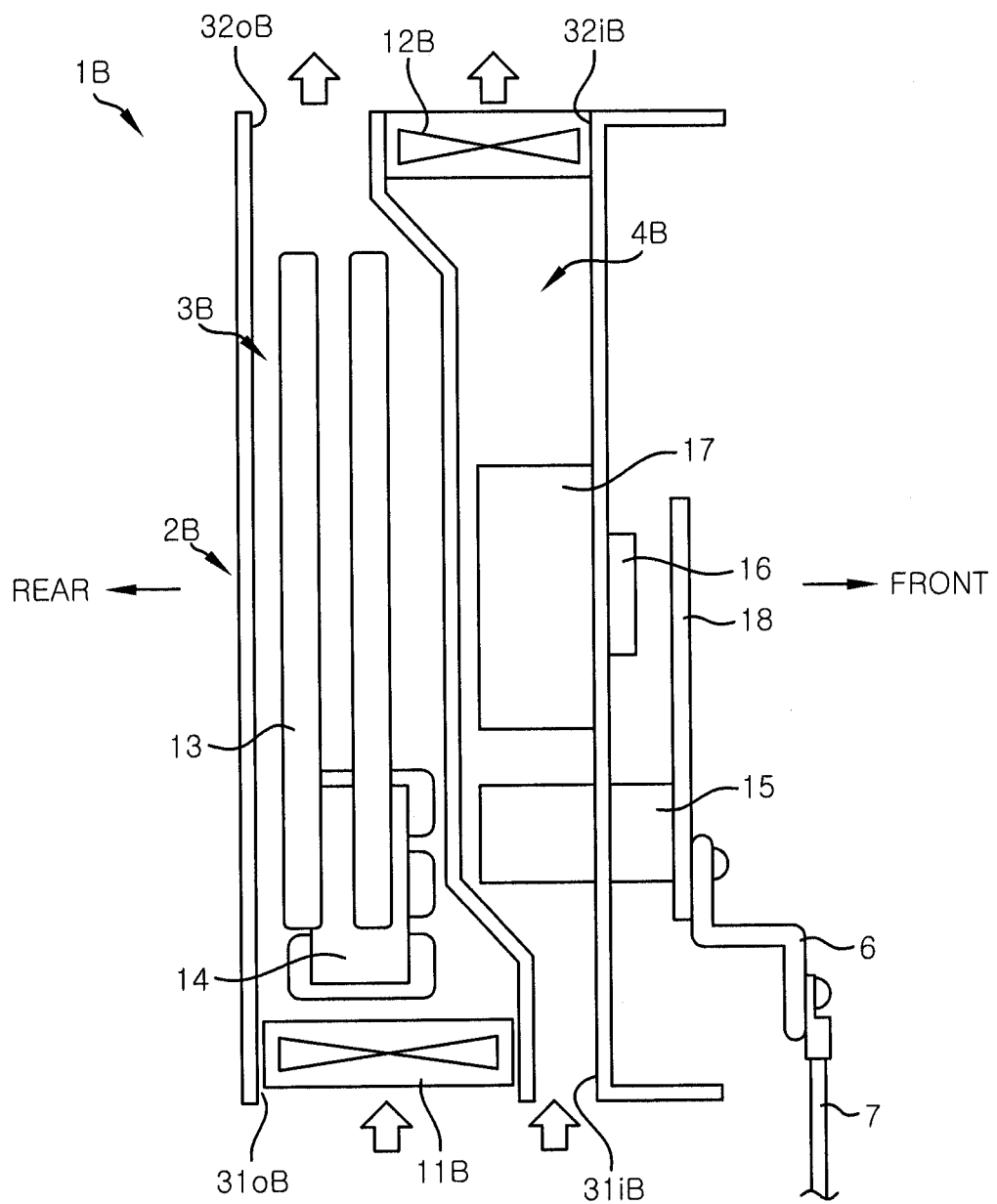
FIG. 5 is a side section view showing another modified example in which both ducts are formed into a rectilinear shape.

In the foregoing embodiment and modified example described above, the outer duct 3 or 3A and the inner duct 4 or 4A are formed into a curved structure having a substantially L-like shape. However, the present invention is not limited thereto. For example, as shown in FIG. 5, there may be provided two ducts 3B and 4B having a substantially rectilinear shape in the up-down direction. In the modified example shown in FIG. 5, there is also provided a configuration in which large-diameter blower fans 11B and 12B are arranged at the side of both the cooling air inlet ports 31oB and 31iB and the cooling air outlet ports 32oB and 32iB.

If the flow paths of the outer duct 3B and the inner duct 4B are all formed into a substantially rectilinear shape in this manner, the cooling air smoothly flows through the flow paths, which makes it possible to further enhance the cooling performance.

In addition to the above, the foregoing embodiment and modified examples may be used in combination.

In the foregoing embodiment and modified examples described above, the blower fans are provided in the cooling air inlet port of the outer duct and in the cooling air outlet port of the inner duct. However, the present invention is not limited thereto. Alternatively, the blower fans may be provided in the cooling air outlet port of the outer duct and in the cooling air inlet port of the inner duct. In this case, it is possible to obtain the same effects as stated above.

While one preferred embodiment of the present invention has been described above, the present invention is not limited to this specific embodiment but may be modified or changed in many different forms without departing from the scope of the invention defined in the claims.

What is claimed is:

1. A power converter comprising:
   a plurality of heat generators, at least some of which are arranged within a wind tunnel portion through which a cooling air flows; and
   a housing enclosing the wind tunnel portion,
   wherein the wind tunnel portion includes: a first duct having a first cooling air inlet port, a first cooling air outlet port, a first cooling air flow path extending between the first cooling air inlet port and the first cooling air outlet port and a first blower fan provided at the first cooling air inlet port; and a second duct having a second cooling air inlet port, a second cooling air outlet port, a second cooling air flow path extending between the second cooling air inlet port and the second cooling air outlet port and a second blower fan provided at the second cooling air outlet port,
   wherein the first and the second cooling air flow paths are in a parallel arrangement relationship, the first and second cooling air inlet ports of the first duct and the second duct being arranged adjacent to each other, the first and the second cooling air outlet ports of the first duct and the second duct being arranged adjacent to each other, at least one of the heat generators being arranged within the first duct and the remainder of the heat generators being arranged within the second duct,
   wherein the cooling air is drawn into the first and second ducts in an air intake direction and is discharged from the first and second ducts in an air discharge direction,
   wherein the air intake direction is different from the air discharge direction,
   wherein the first and the second cooling air flow paths are curved at respective midway positions,
   wherein the housing includes
      an inner rear wall portion disposed between the first and second cooling air flow paths; and
      an inner top wall portion extending from the inner rear wall portion in a direction perpendicular to the inner rear wall portion so as to form a corner, wherein the inner rear wall portion and the inner top wall portion serve as partition walls between the first duct and the second duct, and wherein the respective midway positions are contiguous with the corner of the inner rear wall portion and the inner top wall portion.

2. The power converter of claim 1, wherein the heat generators includes a heat generator having a largest heat generation amount and a heat generator having a second largest heat generation amount, one of which is arranged within the first duct and the other of which is arranged within the second duct.

3. The power converter of claim 1, wherein the first duct, the second duct and the housing are formed into one piece by sharing adjacent wall portions.

4. The power converter of claim 1, wherein the air intake direction is substantially perpendicular to the air discharge direction.

* * * * *